United States Patent
Joh (10) Patent No.: US 7,705,468 B2
(45) Date of Patent: Apr. 27, 2010

(54) STACKED SEMICONDUCTOR PACKAGE THAT PREVENTS DAMAGE TO SEMICONDUCTOR CHIP WHEN WIRE-BONDING AND METHOD FOR MANUFACTURING THE SAME

(75) Inventor: Cheol Ho Joh, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 333 days.

(21) Appl. No.: 11/940,522

(22) Filed: Nov. 15, 2007

(65) Prior Publication Data
US 2009/0096075 A1 Apr. 16, 2009

(30) Foreign Application Priority Data
Oct. 16, 2007 (KR) .................. 10-2007-0103880

(51) Int. Cl.
*H01L 23/52* (2006.01)
(52) U.S. Cl. .................. 257/777; 257/E25.018; 257/685; 257/686; 438/108
(58) Field of Classification Search .......... 257/E21.499, 257/E23.001, E23.013, E25.018, 685, 686, 257/723, 777; 438/108, 109; 361/760
See application file for complete search history.

(56) References Cited

U.S. PATENT DOCUMENTS

| | | | | |
|---|---|---|---|---|
| 5,864,177 | A * | 1/1999 | Sundstrom | 257/723 |
| 6,461,897 | B2 * | 10/2002 | Lin et al. | 438/109 |
| 6,525,986 | B2 * | 2/2003 | Prutchi et al. | 365/230.03 |
| 7,262,506 | B2 | 8/2007 | Mess et al. | |
| 7,285,864 | B2 * | 10/2007 | Takyu et al. | 257/777 |
| 7,342,309 | B2 * | 3/2008 | Yoshida | 257/723 |
| 7,352,057 | B2 * | 4/2008 | Grafe et al. | 257/686 |
| 7,402,911 | B2 * | 7/2008 | Thomas et al. | 257/777 |
| 7,408,245 | B2 * | 8/2008 | Hung et al. | 257/666 |
| 7,615,853 | B2 * | 11/2009 | Shen et al. | 257/676 |
| 2005/0029645 | A1 * | 2/2005 | Mess et al. | 257/686 |
| 2005/0116331 | A1 * | 6/2005 | Tsunozaki | 257/686 |
| 2006/0267173 | A1 * | 11/2006 | Takiar et al. | 257/686 |
| 2007/0102801 | A1 * | 5/2007 | Ishida et al. | 257/686 |
| 2008/0073770 | A1 * | 3/2008 | Yee et al. | 257/686 |
| 2008/0150111 | A1 * | 6/2008 | Hiller et al. | 257/686 |

(Continued)

FOREIGN PATENT DOCUMENTS

KR 1020070104236 A 10/2007

(Continued)

*Primary Examiner*—Chris C Chu
(74) *Attorney, Agent, or Firm*—Ladas & Parry LLP (57) ABSTRACT

A stacked semiconductor package includes a substrate having first and second contact pads. A first stacked package group is disposed on the substrate, and the first stacked package group includes first semiconductor chips stacked in a stair form to expose first edge bonding pads. First conductive wires are used to electrically couple the first edge bonding pads and the first contact pads. An adhesive member is disposed on the uppermost first semiconductor chip, and a second stacked package group is disposed on the adhesive member. The second stacked package group includes second semiconductor chips that are stacked in a stair form to expose second edge bonding pads. When the second stacked package group is disposed on the adhesive member, the bottommost second semiconductor chips is aligned with the uppermost first semiconductor chip. Second conductive wires are used to electrically couple the second edge bonding pads and the second contact pads.

13 Claims, 4 Drawing Sheets

U.S. PATENT DOCUMENTS

| | | |
|---|---|---|
| 2008/0150158 A1* | 6/2008 | Chin ............................ 257/777 |
| 2009/0032969 A1* | 2/2009 | Pilla ............................ 257/777 |
| 2009/0065948 A1* | 3/2009 | Wang ........................... 257/777 |
| 2009/0085223 A1* | 4/2009 | Nishiyama et al. ........... 257/777 |
| 2009/0108470 A1* | 4/2009 | Okada et al. ................. 257/777 |
| 2009/0273096 A1* | 11/2009 | Hiew et al. ................... 257/777 |

FOREIGN PATENT DOCUMENTS

KR    1020080022814 A    3/2008

* cited by examiner

FIG.6

STACKED SEMICONDUCTOR PACKAGE THAT PREVENTS DAMAGE TO SEMICONDUCTOR CHIP WHEN WIRE-BONDING AND METHOD FOR MANUFACTURING THE SAME

CROSS-REFERENCE TO RELATED APPLICATIONS

The present application claims priority to Korean patent application number 10-2007-0103880 filed on Oct. 16, 2007, which is incorporated herein by reference in its entirety.

BACKGROUND OF THE INVENTION

The present invention relates to a stacked semiconductor package and a method for manufacturing the same, and more particularly to a stacked semiconductor package in which semiconductor chips are formed in a stair manner to prevent damage, and method for manufacturing the same.

Recent developments in semiconductor manufacturing technology have lead to various types of semiconductor packages with semiconductor devices suitable for processing more data within a short time.

The semiconductor package is manufactured through: a semiconductor chip manufacturing process that manufactures semiconductor chips having semiconductor devices on a wafer made of high purity silicon; a die sorting process that electrically tests semiconductor chips; and a packaging process that packages the good semiconductor chips.

Recent developments in semiconductor packages include a chip scale package where the size of the semiconductor package is only 100% to 105% of the size of the semiconductor chip and a stacked semiconductor package where a plurality of semiconductor chips are stacked on each other to improve the data capacity and processing speed of the semiconductor device.

Additional technological developments have lead to a semiconductor product that improves data capacity and processing speed by improving the integration density of the semiconductor chip, as well as a semiconductor product that improves data capacity and processing speed by stacking a plurality of semiconductor chips.

Referring now to the stacked semiconductor package with a plurality of stacked semiconductor chips, a high degree of technology is required when coupling bonding pads of the stacked semiconductor chips and contact pads of a substrate using a conductive wire.

When stacking semiconductor chips to improve the data capacity and processing speed the thickness of the semiconductor chip gradually gets thinner. Consequently, the recent semiconductor chip only has a thickness of several tens of micrometers (μm) to several hundreds of micrometers (μm).

However, problems can occur when stacking the semiconductor chips with the thickness of several tens of micrometers (μm) to several hundreds of micrometers (μm). When the bonding pads of the stacked semiconductor chips are bonded to the contact pads of the substrate, a wire bonding facility will use a wire bonding capillary. The semiconductor chips can be damaged due to the excessive impact applied to the semiconductor chips by the capillary.

BRIEF SUMMARY OF THE INVENTION

The present invention provides, inter alia, a stacked semiconductor package capable of stacking a plurality of semiconductor chips by preventing a damage to a semiconductor chip when wire-bonding a bonding pad of the semiconductor chip and a contact pad of a substrate.

Further, the present invention provides, inter alia, a method for manufacturing the stacked semiconductor package.

An embodiment of the present invention provides a stacked semiconductor package comprising: a substrate having first contact pads and second contact pads; a first stacked package group disposed on the substrate and having first semiconductor chips stacked in a stair form to expose first edge bonding pads that are formed on the upper surfaces of the first semiconductor chips; first conductive wires electrically coupling the first edge bonding pads and the first contact pads; an adhesive member disposed on the uppermost first semiconductor chips; a second stacked package group disposed on the adhesive member and having second semiconductor chips that are stacked in a stair form to expose second edge bonding pads located on upper surfaces of the second semiconductor chips, and wherein the lowermost second semiconductor chip is aligned with the uppermost first semiconductor chip; and second conductive wires electrically coupling the second edge bonding pads and the second contact pads.

The first semiconductor chips of the stacked semiconductor package are attached in a stair form along a first direction and the second semiconductor chips are attached in a stair form along a second direction that is opposite to the first direction.

First adhesive members with a first thickness are interposed between the first semiconductor chips of the stacked semiconductor package. The adhesive member formed on the uppermost first semiconductor chip has a second thickness that is thicker than the first thickness.

Second adhesive members with a first thickness are interposed between the second semiconductor chips of the stacked semiconductor package. The adhesive member formed on the uppermost first semiconductor chip has a second thickness that is thicker than the first thickness.

A plurality of first stacked semiconductor package groups and second stacked semiconductor package groups of the stacked semiconductor package may be alternately disposed.

The adhesive member of the stacked semiconductor package covers a loop part of the first conductive wire that electrically couples the edge bonding pad of the first upper semiconductor chip and the first contact pad.

There is also provided a method for manufacturing a stacked semiconductor package according to an embodiment of the present invention comprising the steps of: forming a first stacked package group by stacking first semiconductor chips in a stair form on a substrate comprising first contact pads and second contact pads, wherein the first semiconductor chips are stacked such that first edge boding pads of the semiconductor chips are exposed; coupling the first edge bonding pads and the first contact pads using first conductive wires; forming adhesive members on the uppermost first semiconductor chip of the first stacked package group; forming a second stacked package group comprising second semiconductor chips stacked in a stair form on the adhesive members to expose second edge bonding pads; wherein the lowermost second semiconductor chip is aligned with the uppermost first semiconductor chips; and electrically coupling the second edge bonding pads and the second contact pads by means of second conductive wires.

In the method for manufacturing the stacked semiconductor package, the first semiconductor chips are attached in a stair form along a first direction and the second semiconductor chips are attached in a stair form along a second direction opposed to the first direction.

In the step of forming the first stacked package group, first adhesive members are interposed between the first semiconductor chips.

In the method for manufacturing the stacked semiconductor package, the first adhesive member has a first thickness and the adhesive member has a second thickness thicker than the first thickness.

In the method for manufacturing the stacked semiconductor package, second adhesive members are interposed between the second semiconductor chips.

In the method for manufacturing the stacked semiconductor package, the second adhesive member has a first thickness and the adhesive member has a second thickness thicker than the first thickness.

In the step of forming the adhesive member, the adhesive member covers a loop part of the first conductive wire coupled to the first edge bonding pad of the first upper semiconductor chip.

DESCRIPTION OF SPECIFIC EMBODIMENTS

Figure 1:
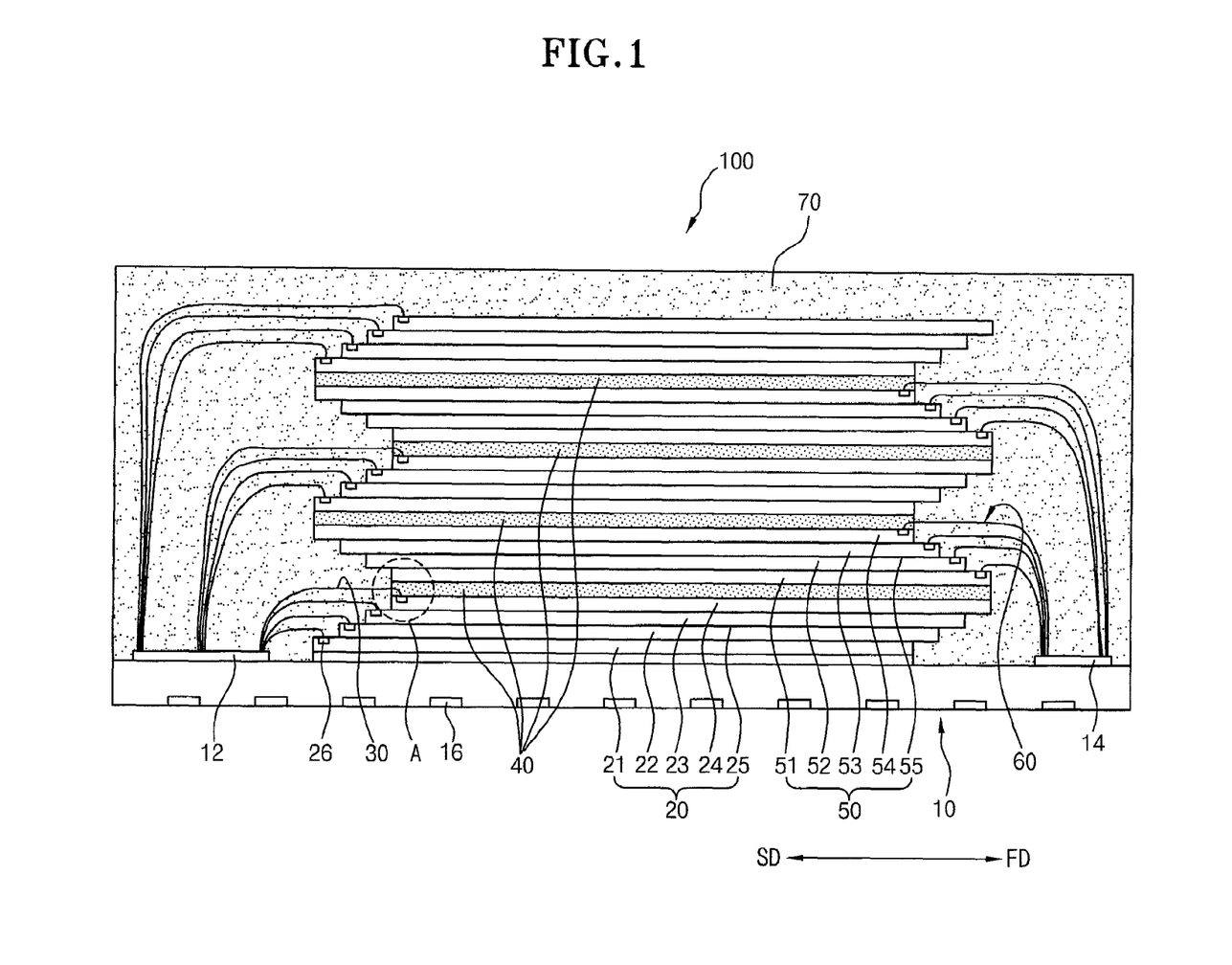
FIG. 1 is a cross-sectional view of a stacked semiconductor package in accordance with an embodiment of the present invention.
Figure 2:
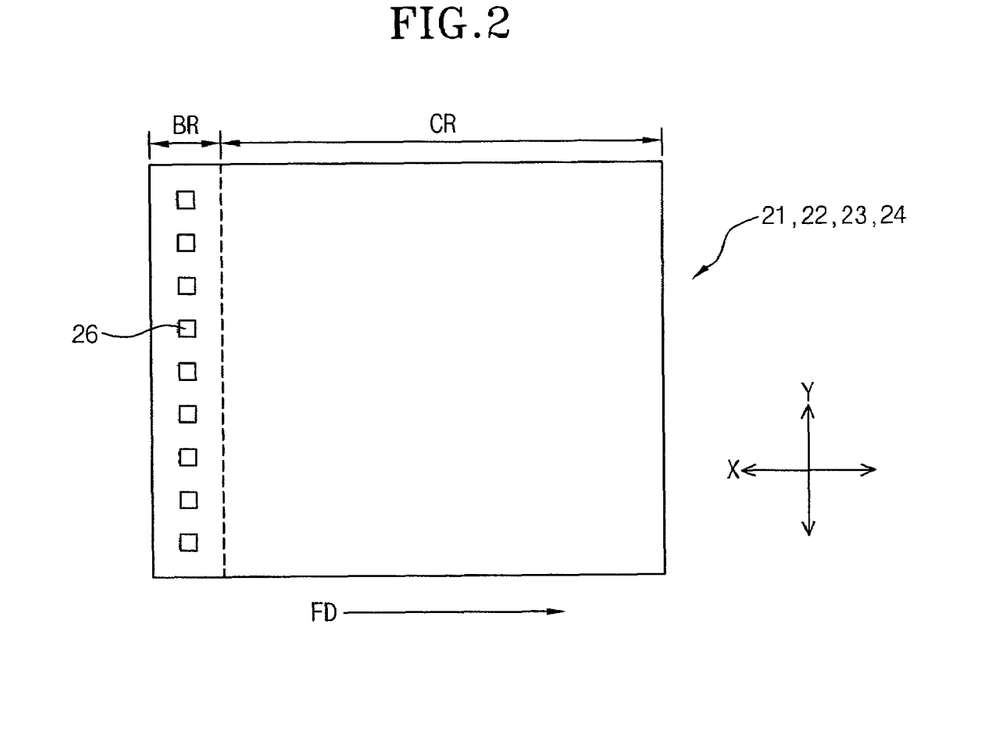
FIG. 2 is a plan view showing one of the first semiconductor chips of the stacked semiconductor package shown in FIG. 1.

FIG. 1 is a cross-sectional view illustrating a stacked semiconductor package in accordance with one embodiment of the present invention, and FIG. 2 is a plan view showing one of the first semiconductor chips of the stacked semiconductor package shown in FIG. 1.

Referring to FIGS. 1 and 2, the stacked semiconductor package 100 comprises a substrate 10, a first stacked package group 20, first conductive wires 30, adhesive members 40, a second stacked package group 50, and second conductive wires 60.

The substrate 10 may have a rectangular parallelepiped plate shape when viewed from a plane. The substrate 10 may be, for example, a printed circuit board.

The substrate 10 comprises first contact pads 12, second contact pads 14, and ball lands 16.

The first contact pads 12 and the second contact pads 14 are disposed on the upper surface of the substrate 10, and the ball lands 16 are disposed on the lower surface of the substrate 10, which is opposite to the upper surface.

The first contact pad 12 is disposed on the edge of one side of the upper surface of the substrate 10, and the second contact pad 14 is disposed on an edge of the other side of the upper surface of the substrate 10, which is opposite to the first side. The ball lands 16 are electrically coupled to the first contact pad 12 and/or the second contact pad 14.

The first stacked package group 20 is attached to the upper surface of the substrate 10. The first stacked package group 20 comprises the first semiconductor chips 21, 22, 23 and 24 and first adhesive members 25 for adhering the first semiconductor chips 21, 22, 23, and 24 to each other.

Referring to FIG. 2, the first semiconductor chips 21, 22, 23, and 24 comprise chip regions (CRs) and bonding regions (BRs). The bonding region (BR) is disposed adjacent to the chip region (CR).

Edge bonding pads 26 are disposed within the bonding region BR. In FIG. 2, the edge bonding pads 26 are disposed in a direction parallel to the Y-axis of FIG. 2.

Each edge bonding pad 26 of the first semiconductor chips 21, 22, 23, and 24 (which is in the first stacked package group 20 attached on the substrate 10) is disposed adjacent to the first contact pads 12.

The first adhesive members 25 are disposed between a pair of adjacent first semiconductor chips 21, 22, 23, and 24. The first adhesive member 25 may be, for example, a double-sided adhesive tape or an adhesive.

The first semiconductor chips 21, 22, 23, and 24 of the first stacked package group 20 are stacked such that they overlap in a stair form along a first direction (FD). As a result, the edge bonding pads 26 in the bonding region (BR) of the first semiconductor chips 21, 22, 23, and 24 are exposed.

The first conductive wires 30 electrically couples each of the edge bonding pads 26 of the first semiconductor chips 21, 22, 23, and 24 (which are disposed adjacent to each other) to each of the first contact pads 12 of the substrate 10.

Figure 3:
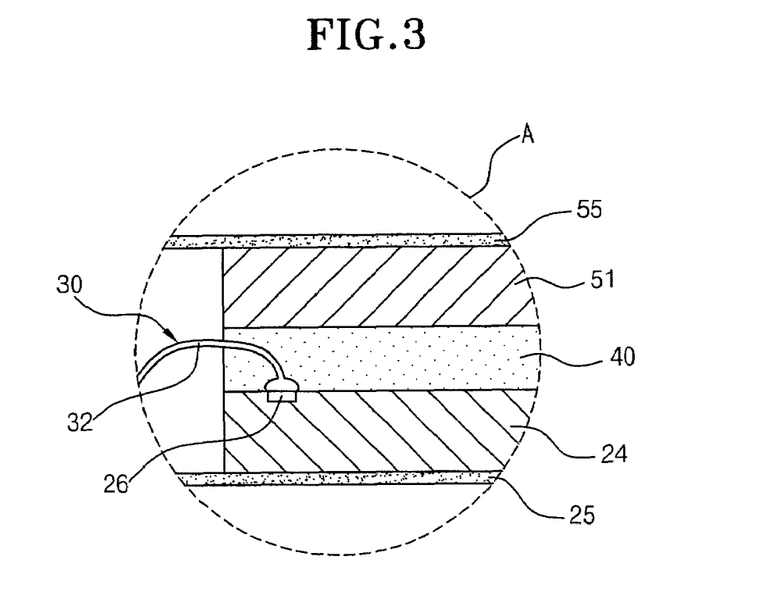
FIG. 3 is a partially enlarged view of 'A' in FIG. 1.

FIG. 3 is a partially enlarged view of "A" of FIG. 1.

Referring to FIGS. 1 and 3, the adhesive member 40 is directly disposed on the uppermost first semiconductor chip 24 of the first stacked package group 20. In the present embodiment, the adhesive member 40 has the same shape and area as the first semiconductor chip 24, and the adhesive member 40 covers a portion of a loop part 32 in the first conductor wire 30 (which is electrically coupled to the edge bonding pad 26 of the first semiconductor chip 24). The adhesive member 40 isolates the loop part 32 of the first conductive wire 30 from a second stacked package 50 (described later).

Referring again to FIG. 1, the second stacked package group 50 is attached on the adhesive member 40. The second stacked package group 50 comprises a plurality of second semiconductor chips 51, 52, 53, and 54 and second adhesive members 55.

Figure 4:
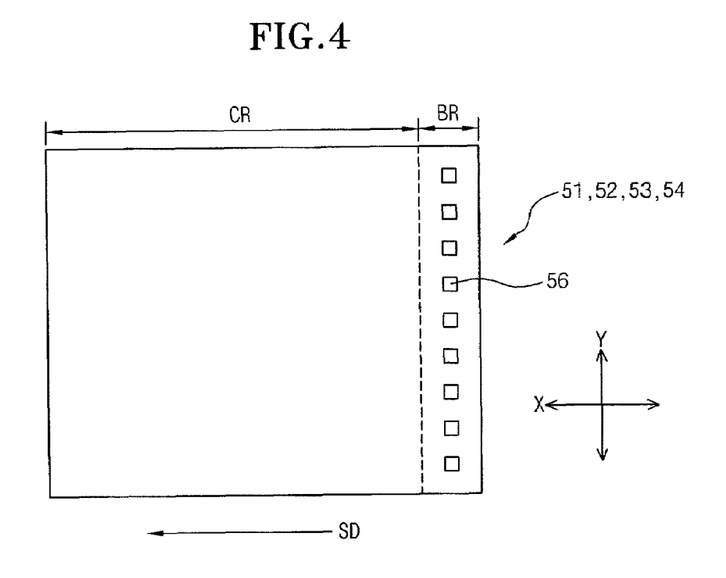
FIG. 4 is a plan view showing second semiconductor chips of the second stacked package group of FIG. 1.

FIG. 4 is a plan view showing the second semiconductor chips of the second stacked package group of FIG. 1.

Referring to FIG. 4, the second semiconductor chips 51, 52, 53, and 54 comprises the chip region (CR) and the bonding region (BR). The bonding region (BR) is disposed adjacent to the chip region (CR). Edge bonding pads 56 are disposed in the bonding region (BR). In FIG. 4, the edge bonding pads 56 are disposed in a direction parallel to the Y-axis of FIG. 4.

Each edge bond pad 56 of each second semiconductor chip 51, 52, 53, and 54 (which are in the second stacked package group 50 attached to the adhesive member 40) is disposed to be adjacent to the second contact pads 14 of the substrate 10. In the present embodiment, the shape and size of the second semiconductor chips 51, 52, 53, and 54 are substantially the same as the shape and size of the first semiconductor chips 21, 22, 23, and 24.

The second semiconductor chips 51, 52, 53, and 54 of the second stacked package group 50 are stacked such that they overlap each other in a stair form along a second direction (SD) (which is opposite to the first direction (FD)) so that the edge bonding pads 56 in the bonding region (BR) of the second semiconductor chips 51, 52, 53, and 54 are exposed.

The second adhesive members 55 are interposed between the adjacent second semiconductors chips 51, 52, 53, and 54.

The second adhesive member 55 may be, for example, an adhesive or a double-sided adhesive tape.

In the present embodiment, the second semiconductor chip 51, which is the second semiconductor chip directly adhered to the adhesive member 40, is aligned with the first semiconductor chip 24 of the first stacked package group 20. In other words, in the first and second semiconductor chips 24 and 51 that are disposed on both sides of the adhesive member, the edge of the first semiconductor chip 24 of the first stacked package group 20 and the edge of the second semiconductor chip 51 of the second stacked package group 50 are aligned.

When the first semiconductor chip 24 of the first stacked package group 20 and the second semiconductor chip 51 of the second stacked package group 50 are aligned, the adhesive member 40 and the first semiconductor chip 24 support the second semiconductor chip 51. Accordingly, when a wire bonding facility's capillary is used to wire-bond the edge bonding pad 56 of the second semiconductor chip 51 and the second conductive wire 60, damage to the second semiconductor chip 51 typically caused by the capillary can be prevented.

On the other hand, if the second semiconductor chip 51 of the second stacked package group 50 were formed to protrude from the first semiconductor chip 24 of the first stacked package group 20, damage to the second semiconductor chip 51 caused by the capillary can occur when the second conductive wire 60 is bonded to the edge bonding pad 56 of the second semiconductor chip 51.

The second conductive wire 60 electrically couples the second contact pads 14 to each edge bonding pad 56 of the second semiconductor chips 51, 52, 53, and 54 (which are disposed adjacent to the second contact pads 14).

In the present embodiment, at least two first stacked package groups 20 and second stacked package groups 50 are alternated when disposed, so that about 20 first and second semiconductor chips can be stacked in the stacked semiconductor package 100.

A molding member 70 is formed over the first and second stacked package groups 20 and 50 stacked on the substrate 10 and the first and second conductive wires 30 and 60. Examples of materials that may be used for the molding member 70 include epoxy resin, etc.

Figure 5:
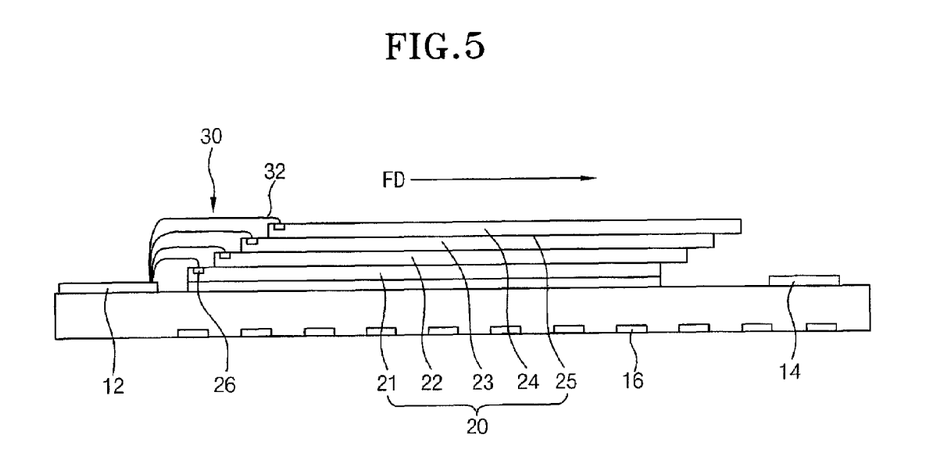
FIGS. 5 and 6 are cross-sectional views showing a method for manufacturing the stacked semiconductor package in accordance with one embodiment of the present invention.
Figure 6:
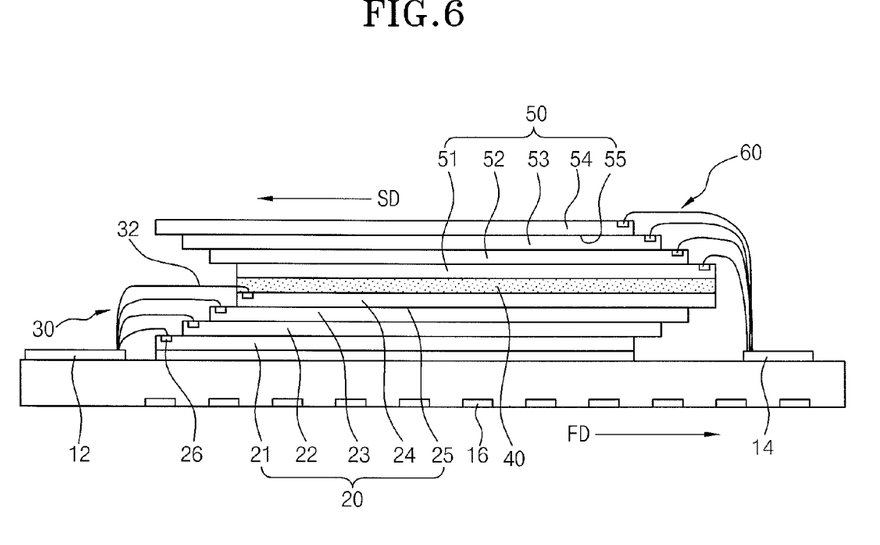

FIGS. 5 and 6 are cross-sectional views showing a method for manufacturing a stacked semiconductor package in accordance with one embodiment of the present invention.

Referring to FIG. 5, the first stacked package group 20 is disposed on the substrate 10 in order to manufacture the stacked semiconductor package.

The substrate 10 has a rectangular parallelepiped plate shape when viewing from a plane. The substrate 10 may be, for example, a printed circuit board comprising first contact pads 12, second contact pads 14, and ball lands 16.

The first contact pad 12 is disposed on the edge of one side of the upper surface of the substrate 10, and the second contact pad 14 is disposed on the edge of the opposite side of the upper surface of the substrate 10. The ball land 16 is disposed on the lower surface (which is opposite the upper surface) of the substrate 10. The ball land 16 is electrically coupled to the first contact pad 12 and/or the second contact pad 14.

The first semiconductor chips 21, 22, 23, and 24 are prepared to form the first stacked package group 20 on the substrate 10.

Each of the first semiconductor chips 21, 22, 23, and 24 has the chip regions and the bonding regions described above. Edge bonding pads 26 are disposed in the bonding regions of each of the first semiconductor chips 21, 22, 23, and 24.

The first semiconductor chip 22 is attached to the upper surface of the first semiconductor chip 21 on the chip region of the first semiconductor chip 21. The first semiconductor chips 21 and 22 are attached by means of the first adhesive member 25, and the edge bonding pads 26 of the first semiconductor chip 21 are exposed.

Another first semiconductor chip 23 is then attached to the upper surface of the other first semiconductor chip 22 in the chip region. Once again, these first semiconductor chips 22 and 23 are attached by means of the first adhesive member 25, and the edge bonding pads 26 of the other semiconductor chip 22 are exposed.

Thereafter, a final first semiconductor chip 24 is attached to the upper surface of the another semiconductor chip 23 in the chip region of the another first semiconductor chip 23. The first semiconductor chips 23 and 24 are attached by means of the first adhesive member 25, and the edge bonding pad 25 of the another first semiconductor chip 23 and the final first semiconductor chip 24 are exposed.

In the present embodiment, the first adhesive member 25 has a first thickness and the first adhesive member 25 may be, for example, a double-sided adhesive tape or an adhesive.

As described above, when the first semiconductor chips 21, 22, 23, and 24 are stacked, the first semiconductor chips 21, 22, 23, and 24 are stacked such that they overlap in a stair form toward a first direction (FD) as shown in FIG. 5.

After the first stacked package group 20 is formed on the substrate 10, the first contact pads 12 of the substrate 10 and each edge bonding pads 25 of the first semiconductor chips 21, 22, 23, and 24 are electrically coupled by means of first conductive wires 30.

Referring to FIG. 6, after the edge bonding pads 25 of the first semiconductor chips 21, 22, 23, and 24 and the first contact pads 12 of the substrate 10 are electrically coupled by means of the first conductive wires 30, an adhesive member 40 is disposed on the uppermost first semiconductor chip 24 of the first stacked package group 20.

The adhesive member 40 may be, for example, a fluidity adhesive applied on the upper surface of the semiconductor chip 24. Alternatively, the adhesive member 40 may be an adhesive tape applied on the upper surface of the first semiconductor chip 24. The attachment area of the adhesive member 40 may be substantially the same as the area of the first semiconductor chip 24.

In the present embodiment, the adhesive member 40 covers the loop part 32 of the first conductive wire 30 (which is electrically coupled to the edge bonding pad 26 of the first semiconductor chip 24). In the present embodiment, the adhesive member 40 has a second thickness, and the second thickness of the adhesive member 40 may have, for example, a thickness greater than the first thickness of the first adhesive member 25.

The first conductive wire 30 electrically coupled to the edge bonding pad 26 of the first semiconductor chip 24 is electrically isolated from the second semiconductor chip 51 of the second stacked package group 20 (described later) by means of the adhesive member 40.

After the adhesive member 40 is disposed on the first semiconductor chip 24 of the first stacked package group 20, the second stacked package group 50 is disposed on the adhesive member 40.

The second stacked package group 50 comprises the second semiconductor chips 51, 52, 53, and 54.

Each of the second semiconductor chips 51, 52, 53, and 54 has chip regions and bonding regions, and a plurality of edge bonding pads 56 is disposed in each of the bonding regions of the second semiconductor chips 51, 52, 53, and 54.

The second semiconductor chip 51, among the second semiconductor chips 51, 52, 53, and 54, is directly attached on the adhesive member 40.

The second semiconductor chip 51 of the second stacked package group 50 is aligned exactly with the first semiconductor chip 24 of the first stacked package group 20.

In the present embodiment, since the second semiconductor chip 51 is exactly aligned with the first semiconductor chip 24, damage to the second semiconductor chip 51 is prevented during the wire bonding process.

Other semiconductor chip 52 is attached to the upper surface of the second semiconductor chip 51 in the second semiconductor chip's 51 chip region. A second adhesive member 55 is used to attach the second semiconductor chips 51 and 52, and the edge bonding pad 56 of the second semiconductor chip 51 is exposed.

Another second semiconductor chip 53 is then attached to the upper surface of the other second semiconductor chip 52 in the cell region of the other second semiconductor chip 52. The second semiconductor chips 52 and 53 are attached by means of the second adhesive member 55 and the edge bonding pad 56 of the other semiconductor chip 52 is exposed.

A final second semiconductor chip 54 is then attached to the upper surface of the another second semiconductor chip 53 in the another second semiconductor chip's 53 cell region. The second semiconductor chips 53 and 54 are attached by means of the second adhesive member 55, and the edge bonding pad 56 of the another second semiconductor chip 52 and the final second semiconductor chip 54 are exposed.

In the present embodiment, the second adhesive member 55 has a first thickness, and the second adhesive member 55 may be, for example, a double-sided adhesive tape or an adhesive.

As described above, when the second semiconductor chips 51, 52, 53, and 54 are stacked, the second semiconductor chips 51, 52, 53, and 54 are stacked such that they overlap in a stair form toward a second direction (SD) shown in FIG. 6, which is opposite to the first direction (FD).

After the second stacked package group 50 is formed on the adhesive member 40, the second contact pads 14 of the substrate 10 and the edge bonding pads 55 of the second semiconductor chips 51, 52, 53, and 54 are electrically coupled by means of the second conductive wires 60.

At this time, the second semiconductor chip 51 of the second stacked package group 50 is supported by the adhesive member 40 and the first semiconductor chip 24 of the first stack package group 20, so that damage to the second semiconductor chip 51 can be prevented when the second conductive wire 60 is bonded to the second semiconductor chip 51.

The first and second stacked package groups 20 and 50 and the first and second conductive wires 30 and 60 can be alternated several times according to the aforementioned method. For example, the stacked semiconductor package 100 according to the present invention can easily stack about 20 to 30 semiconductor chips.

Referring again to FIG. 1, after the first and second stacked package groups 20 and 50 are disposed on the substrate 10, the first and second stacked package groups 20 and 50 and the first and second conductive wires 30 and 60 are molded by means of the molding member 70, and as such the stacked semiconductor package 100 is manufactured.

According to the detailed description as above, when forming the first stacked package group by disposing the semiconductor chips in a stair form toward a first direction and then forming the second stacked package group by disposing the semiconductor chips in a stair form toward a second opposite direction and attaching the second stacked package group to the first stacked package group using an adhesive member, the upper semiconductor chips of the first stacked package group and the lower semiconductor chips of the second stacked package group are aligned such that damage to the semiconductor chips can be prevented during the wire bonding process. This makes it possible to easily stack a plurality of semiconductor chips.

Although specific embodiments of the present invention have been described for illustrative purposes, those skilled in the art will appreciate that various modifications, additions and substitutions are possible without departing from the scope and the spirit of the invention as disclosed in the accompanying claims.

What is claimed is:

1. A stacked semiconductor package comprising:
   a substrate having first contact pads and second contact pads;
   a first stacked package group disposed on the substrate and comprising a plurality of first semiconductor chips, each first semiconductor chip having a plurality of first edge bonding pads formed on a first edge of an upper surface of the semiconductor chip, wherein the first semiconductor chips are stacked such that the first semiconductor chips overlap in a stair form to expose the first edge bonding pads;
   first conductive wires electrically coupling the first edge bonding pads and the first contact pads;
   an adhesive member disposed on an uppermost first semiconductor chip;
   a second stacked package group disposed on the adhesive member and comprising second semiconductor chips having a plurality of second edge bonding pads formed on a second edge of an upper surface of the second semiconductor chips, wherein the second semiconductor chips are stacked to overlap in a stair form to expose the second edge bonding pads;
   wherein a lowermost second semiconductor chip is aligned with the uppermost first semiconductor chip; and
   second conductive wires electrically coupling the second edge bonding pads and the second contact pads.

2. The stacked semiconductor package according to claim 1, wherein the first edge of the first semiconductor chip is opposite to the second edge of the second semiconductor chip, and the first semiconductor chips are attached in a stair form along a first direction and the second semiconductor chips are attached in a stair form along a second direction opposed to the first direction.

3. The stacked semiconductor package according to claim 1, wherein the first stacked package group further comprises first adhesive members with a first thickness are interposed between the first semiconductor chips, and the second stacked package group further comprises second adhesive members with the first thickness are interposed between the second semiconductor chips.

4. The stacked semiconductor package according to claim 3, wherein the adhesive member disposed on the uppermost first semiconductor chip has a second thickness and the second thickness of the adhesive member is thicker than the first thickness of the second adhesive members.

5. The stacked semiconductor package according to claim 1, wherein a plurality of first stacked semiconductor package groups and second stacked semiconductor package groups are alternately disposed.

6. The stacked semiconductor package according to claim 1, wherein the adhesive member of the stacked semiconductor package covers a loop portion of the first conductive wire.

7. A method for manufacturing a stacked semiconductor package comprising the steps of:
- forming a first stacked package group by stacking first semiconductor chips such that the first semiconductor chips overlap in a stair form on a substrate comprising first contact pads and second contact pads, wherein the first semiconductor chips comprise first edge bonding pads formed on a first edge of an upper surface of the first semiconductor chip, and wherein the first edge bonding pads are exposed;
- electrically coupling the first edge bonding pads and the first contact pads by means of first conductive wires;
- forming an adhesive member on an uppermost first semiconductor chip;
- forming a second stacked package group by stacking second semiconductor chips such that the second semiconductor chips overlap in a stair form on the adhesive member, wherein the second semiconductor chips comprise second edge bonding pads formed on a second edge of an upper surface of the second semiconductor chip, and wherein the second edge bonding pads are exposed;
  - wherein, when forming the second stacked package group, a lowermost second semiconductor chip is aligned with the uppermost first semiconductor chip; and
- electrically coupling the second edge bonding pads and the second contact pads by means of second conductive wires.

8. The method according to claim 7, wherein the first edge of the first semiconductor chip is opposite to the second edge of the second semiconductor chip, and the first semiconductor chips are attached in a stair form along a first direction and the second semiconductor chips are attached in a stair form along a second direction that is opposite to the first direction.

9. The method according to claim 7, wherein the step of forming the first stacked package group further comprises: interposing first adhesive members between the stacked first semiconductor chips.

10. The method according to claim 9, wherein the first adhesive member has a first thickness, the adhesive member disposed on the uppermost first semiconductor chip has a second thickness, and the second thickness is thicker than the first thickness.

11. The method according to claim 7, wherein in the step of forming the second stacked package group further comprises: interposing second adhesive members between the second semiconductor chips.

12. The method according to claim 11, wherein, the second adhesive member has a first thickness and the adhesive member formed on the uppermost first semiconductor chip has a second thickness, and the second thickness is thicker than the first thickness.

13. The method according to claim 7, wherein the adhesive member is formed to cover a loop part of the first conductive wire.

* * * * *